United States Patent [19]

Martin

[11] Patent Number: 5,276,384
[45] Date of Patent: Jan. 4, 1994

[54] ELECTRODE CONFIGURATION FOR CHANNEL CONFINEMENT OF PLASMA DISCHARGE IN AN ELECTRODE STRUCTURE USING AN IONIZABLE GASEOUS MEDIUM

[75] Inventor: Paul C. Martin, Vancouver, Wash.

[73] Assignee: Tektronix, Inc., Wilsonville, Oreg.

[21] Appl. No.: 937,797

[22] Filed: Aug. 26, 1992

[51] Int. Cl.⁵ ............................................. H01J 17/49
[52] U.S. Cl. .................................. 313/582; 313/517; 315/169.4
[58] Field of Search ............... 313/517, 581, 582, 583, 313/584, 585; 315/169.4

[56] References Cited

U.S. PATENT DOCUMENTS

| | | | |
|---|---|---|---|
| 3,792,301 | 2/1974 | Kessler | 313/582 |
| 3,810,686 | 5/1974 | Coleman | 313/583 |
| 4,322,659 | 3/1982 | De Jule et al. | 315/169.1 |
| 4,352,101 | 9/1982 | De Jule | 340/769 |
| 4,395,244 | 7/1983 | Glaser | 445/25 |
| 4,550,039 | 10/1985 | Glaser et al. | 428/13 |
| 4,728,864 | 3/1988 | Dick | 313/582 |
| 4,896,149 | 1/1990 | Buzak et al. | 340/794 |

OTHER PUBLICATIONS

Tannas, Lawrence E. Jr. ed. Flat Panel Displays and CRTs, 1985, Van Nostrand Reinhold Company, New York, 347-348.
Mikoshiba, Shigeo, "Plasma Displays," Seminar 10 SID 1987, 10.2-10.37.
Dick, George W., "Plasma Display Panel Techniques," Seminar 2, SID 1985 2.2-1 - 2.2-54.

Primary Examiner—Alvin E. Oberley
Assistant Examiner—Lun-Yi Lao
Attorney, Agent, or Firm—John D. Winkelman; Paul S. Angello

[57] ABSTRACT

An improved electrode structure (42', 42'') for an addressing structure using an ionizable gaseous medium has a plurality of plasma discharge channels (20') and a reference electrode (30', 30'') and a row electrode (62') extending along each channel. The channels open into a plenum (118) for exhausting gases from the channels and introducing into the channels an ionizable gaseous medium at a predetermined pressure. The reference electrodes and the row electrodes enter from opposite ends of the channels, and the reference electrodes cross below the plenum. The row electrodes have an end (110) spaced from the ends (102) of the channels. The end of the row electrodes is separated from the end of the channels by a first distance (D) adequate to prevent undesirable plasma discharge while the electrode structure is operating. In a first embodiment (42') the reference electrodes have an end (112) spaced from a first perimeter seal (106). The ends of the reference electrodes are separated from the first perimeter seal by a second distance (E) adequate to prevent substantial erosion or other disassociation of the first perimeter seal resulting from plasma discharge in the channel. In a second embodiment (42'') the ends (112') of the reference electrodes are embedded in the first perimeter seal (106').

20 Claims, 7 Drawing Sheets

ELECTRODE CONFIGURATION FOR CHANNEL CONFINEMENT OF PLASMA DISCHARGE IN AN ELECTRODE STRUCTURE USING AN IONIZABLE GASEOUS MEDIUM

TECHNICAL FIELD

This invention pertains to the electrode structure of a system constructed of data storage elements which are addressable with the use of an ionizable gas.

BACKGROUND OF THE INVENTION

U.S. Pat. No. 4,896,149, issued Jan. 23, 1990 ("'149 Patent"), discloses an addressing structure using an ionizable gaseous medium. Such an addressing structure may be used in a system constructed of data storage elements which addresses those data storage elements with the use of an ionizable gas. An example of such a system is a flat panel display, a video camera, or a memory system.

The addressing structure includes an electrode structure having plasma discharge channels for containing the ionizable gaseous medium. Two electrodes extend within and along the length of each channel. Different ones of those two electrodes are operated as a cathode and an anode. When a voltage of predetermined magnitude is applied between the anode and the cathode in a channel, the gaseous medium in that channel ionizes or "fires" and carries an electrical current between that anode and that cathode.

As explained in the '149 Patent, it is desirable for the anode and the cathode in each channel to be connected to the electrical driving circuits at opposite ends of the channel. (See '149 Patent, col. 7, 11. 43-49; col. 12, 11. 8-30; and FIGS. 11A and 11B.) Such a connection of the anode and the cathode tends more nearly to equalize the potential difference between the anode and the cathode along their lengths when they are firing. The plasma resulting from ionization of the ionizable gaseous medium is then more evenly distributed in the channel and thereby promotes better operation of the addressing structure.

It is also desirable to provide in the electrode structure a pathway or channel for removing gas from, and for introducing the ionizable gaseous medium to, each of the channels. One effective way to provide such a pathway is to form in the electrode structure an open region called a "plenum." One end of each of the channels is open to the plenum, which in turn leads to a suitable input/output channel or valve. The plenum facilitates (1) removal of air and introduction of the desired ionizable gaseous medium during manufacture of the electrode structure and (2) purification and/or replenishment of the ionizable gaseous medium from time to time. The plenum is large enough to allow efficient removal of gases from, and addition of gases to, the channels but is not so large as to occupy too much space.

Typically each channel is of the order of 100-200 times as long as the length of the plenum in a direction parallel to each channel. The width of the plenum in a direction perpendicular to each channel is typically equal to the sum of the distance between the two outermost channels of the electrode structure and the width of a gas fill area located at one end of the plenum. (The width of the gas fill area adds about 0.76-1.5 mm to the length of the plenum.) Because there are typically of the order of hundreds to thousands of channels in an electrode structure, the width of the plenum in a direction perpendicular to the length of the channels is typically of the order of hundreds to thousands of times the width of a channel in a direction perpendicular to the length of the channel.

In an electrode structure in which the anodes and cathodes are to be connected to electrical circuitry at opposite ends of the channels and in which a plenum of the type just described is provided, some of the electrodes cross the plenum. In such an electrode structure, a plasma discharge can occur between an electrode fired in the plenum and another electrode in the plenum at ground.

A typical addressing structure system avoids the expense of providing a switch for each electrode. In such a typical addressing structure each electrode that functions as an anode is continuously referenced to ground, and each individual electrode that functions as a cathode is also referenced to ground except during the brief interval when that individual electrode fires in response to a predetermined firing waveform generated by electronic circuitry. If the addressing structure provided for each electrode a switch that disconnected the electrode except when it was supposed to be firing, then any electrodes could cross the plenum. It is, however, expensive to provide such a switch for each electrode.

In the absence of such a switch, if all electrodes were to cross the plenum, a fired cathode would preferably fire in the plenum. To prevent a fired cathode from firing in the plenum, only electrodes which are to be anodes cross the plenum.

Even when only electrodes which are to be anodes cross the plenum, a plasma discharge can nevertheless exist in the plenum as a result of two causes. First, a plasma discharge in a channel between a fired cathode and an anode located in that channel can spread outside that channel along the length of either that fired cathode or that anode. Second, a plasma discharge in a channel initiated by a fired cathode can extend to either an anode or a cathode at ground in another channel.

A plasma discharge which extends into the plenum can have any one or more of several adverse effects.

First, a plasma discharge in the plenum is likely to carry much more current per unit length of the electrodes involved in the discharge than a plasma discharge in a channel. The walls of the channel and of the plenum act as quenching agents to limit the intensity of a plasma discharge by attracting and/or capturing ions, and/or by neutralizing ions, and/or by promoting neutralization among ions having charges of opposite polarity. However, in the channels the ratio of wall surface to gas volume enclosed is much higher than in the plenum. The walls of the plenum are farther from most of the volume of the plenum than the walls of the channels are from most of the volume of the channels. A plasma discharge in the plenum can thus attract so much of the current flowing between the electrodes involved that the ionizable gaseous medium may not become or remain ionized in a channel in which it was supposed to become or remain ionized. Failure of ionization in a channel will prevent proper operation of the addressing structure.

Second, if the current flowing through a plasma discharge in the plenum is large enough, the involved electrodes may be eroded. (An anode may be eroded by arcing, and a cathode may be eroded by arcing or sputtering.) Undue electrode erosion typically occurs where the current per unit length of the electrode passing between the electrode and the ionizable gaseous medium is much larger than the current per unit length for which the electrode is designed, or is much larger than the current per unit length of other electrodes. In addition, the perimeter seal of the plenum may be eroded, or the material of which the perimeter seal is made may be disassociated, raising the possibility of degradation of the ionizable gaseous medium through leaks in the perimeter seal or through introducing contaminates into the ionizable gaseous medium.

Third, a plasma discharge in the plenum may generate enough ions for the ions to migrate into one or more channels which are not supposed to have ions in them at the time the ions migrate in. Such migrating ions can neutralize the charge controlling the state of memory of display cells of the addressing structure, thereby degrading the operation of the addressing structure.

There is thus a need to find some way to reduce or eliminate plasma discharge in the plenum while permitting the desired plasma formation in the channels.

SUMMARY OF THE INVENTION

An object of the invention is, therefore, to provide an electrode structure for an addressing structure utilizing an ionizable gaseous medium, which electrode structure resists or prevents detrimental plasma discharge in the plenum.

An improved electrode structure according to the invention includes a substrate, a cover, a first perimeter seal, a second perimeter seal, and a plurality of channel-defining portions extending between the substrate and the cover. The channel-defining portions extend from the first perimeter seal but end before the second perimeter seal. The region between the ends of the channel-defining portions, the substrate, the cover, and the second perimeter seal is the plenum. Each channel is defined by a pair of adjacent channel-defining portions, the cover, and the substrate. An electrode which is to act as a cathode extends along each channel toward the second perimeter seal. An electrode which is to act as an anode extends into each channel toward the first perimeter seal. The electrode structure is to be filled with a predetermined ionizable gas at a predetermined pressure, and the anode and the cathode in each channel are to be driven with an electrical signal of predetermined waveform to provide a voltage difference of predetermined magnitude and shape between the anode and the cathode.

Each cathode ends at an end spaced by a first distance from the ends of the channel-defining portions of the channel that contains the cathode. The end of the cathode is thus farther from the plenum, and farther from the second perimeter seal, than the ends of the channel-defining portions which define the channel which contains that cathode. The first distance is selected so that detrimental plasma discharge from the cathode does not reach the plenum.

In another aspect of the invention, the anode in each channel ends at an end spaced by a second distance from the first perimeter seal. This second distance is selected to reduce the plasma discharge intensity in the end of the channel nearest the first perimeter seal and thereby reduce erosion of the first perimeter seal. This tends to prolong the useful life of the electrode structure.

Additional objects and advantages of the present invention will be apparent from the detailed description of preferred embodiments thereof, which proceeds with reference to the accompanying drawings.

BRIEF DESCRIPTION OF THE DRAWINGS

FIG. 9 is taken from FIGS. 10-13 of *Flat-Panel Displays and CRTs* (L. E. Tannas, Jr., ed.) (1985) (New York: Van Nostrand Reinhold).

DETAILED DESCRIPTION OF PREFERRED EMBODIMENTS

The following discussion with reference to FIGS. 1-6 is taken from the '149 Patent to provide background for the description of the present invention. The FIGURE numbers used in the following discussion are the same as those of the present disclosure.

Figure 1:
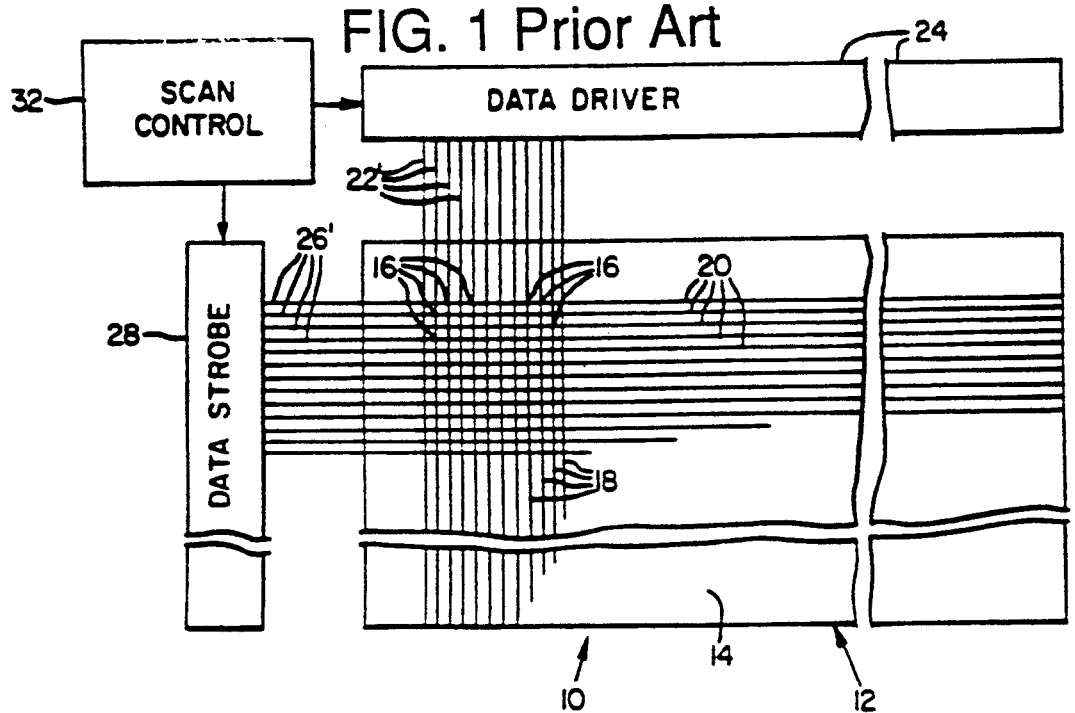
FIG. 1 is a diagram showing a frontal view of the display surface of a display panel and associated drive circuitry of a display system described in the '149 Patent.

FIG. 1 shows a flat panel display system 10, which represents a first embodiment that implements the addressing structure and carries out the addressing method of the present invention. With reference to FIG. 1, flat panel display system 10 comprises a display panel 12 having a display surface 14 that contains a pattern formed by a rectangular planar array of nominally identical data storage or display elements 16 mutually spaced apart by predetermined distances in the vertical and horizontal directions. Each display element 16 in the array represents the overlapping portions of thin, narrow electrodes 18 arranged in vertical columns and elongate, narrow channels 20 arranged in horizontal rows. (The electrodes 18 are hereinafter referred to as "column electrodes 18.") The display elements 16 in each of the rows of channels 20 represent one line of data.

The widths of column electrodes 18 and channels 20 determine the dimensions of display elements 16, which are of rectangular shape. Column electrodes 18 are deposited on a major surface of a first electrically nonconductive, optically transparent substrate, and channels 20 are inscribed in a major surface of a second electrically nonconductive, optically transparent substrate, as will be further described below. Skilled persons will appreciate that certain systems, such as a reflective display of either the direct view or projection type, would require that only one of the substrates be optically transparent.

Column electrodes 18 receive data drive signals of the analog voltage type developed on parallel output conductors 22' by different ones of the output amplifiers 22 (FIGS. 2–6) of a data driver or drive circuit 24, and channels 20 receive data strobe signals of the voltage pulse type developed on parallel output conductors 26' by different ones of the output amplifiers 26 (FIGS. 2–6) of a data strobe or strobe means or strobe circuit 28. Each of the channels 20 includes a reference electrode 30 (FIG. 2) to which a reference potential common to each channel 20 and data strobe 28 is applied.

To synthesize an image on the entire area of display surface 14, display system 10 employs a scan control circuit 32 that coordinates the functions of data driver 24 and data strobe 28 so that all columns of display elements 16 of display panel 12 are addressed row by row in row scan fashion. Display panel 12 may employ electro-optic materials of different types. For example, if it uses such a material that changes the polarization state of incident light rays 33, display panel 12 is positioned between a pair of light polarizing filters 34 and 36 (FIG. 2), which cooperate with display panel 12 to change the luminance of light propagating through them. The use of a scattering liquid crystal cell as the electro-optic material would not require the use of polarizing filters 34 and 36, however. A color filter (not shown) may be positioned within display panel 12 to develop multi-colored images of controllable color intensity. For a projection display, color can also be achieved by using three separate monochrome panels 10, each of which controls one primary color.

With reference to FIGS. 2–5, display panel 12 comprises an addressing structure that includes a pair of generally parallel electrode structures 40 and 42 spaced apart by a layer 44 of electro-optic material, such as a nematic liquid crystal, and a thin layer 46 of a dielectric material, such as glass, mica, or plastic. Electrode structure 40 comprises a glass dielectric substrate 48 that has deposited on its inner surface 50 column electrodes 18 of indium tin oxide, which is optically transparent, to form a striped pattern. Adjacent pairs of column electrodes 18 are spaced apart a distance 52, which defines the horizontal space between next adjacent display elements 16 in a row.

Figure 3:
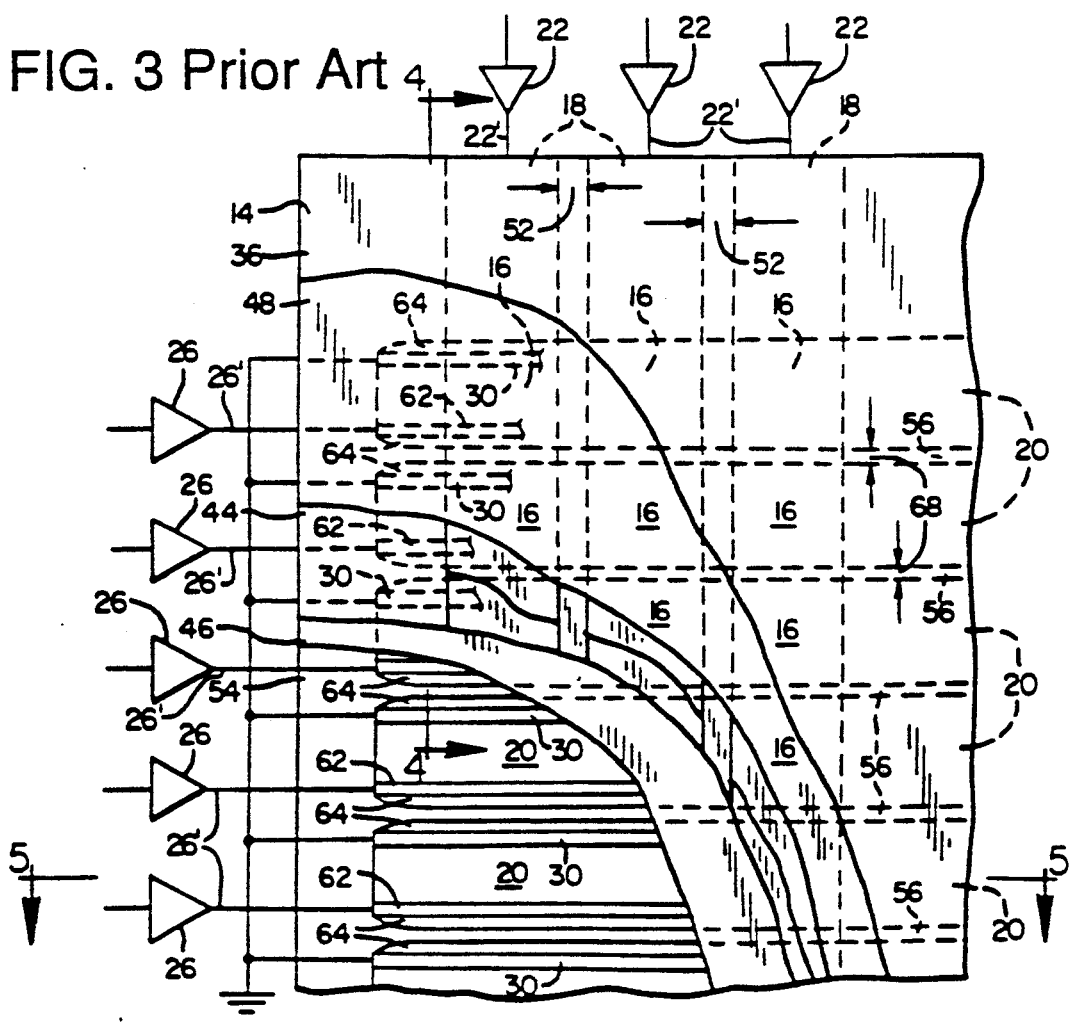
FIG. 3 is an enlarged fragmentary frontal view with portions broken away to show different depthwise views of the interior of the display panel of FIG. 2.
Figure 2:
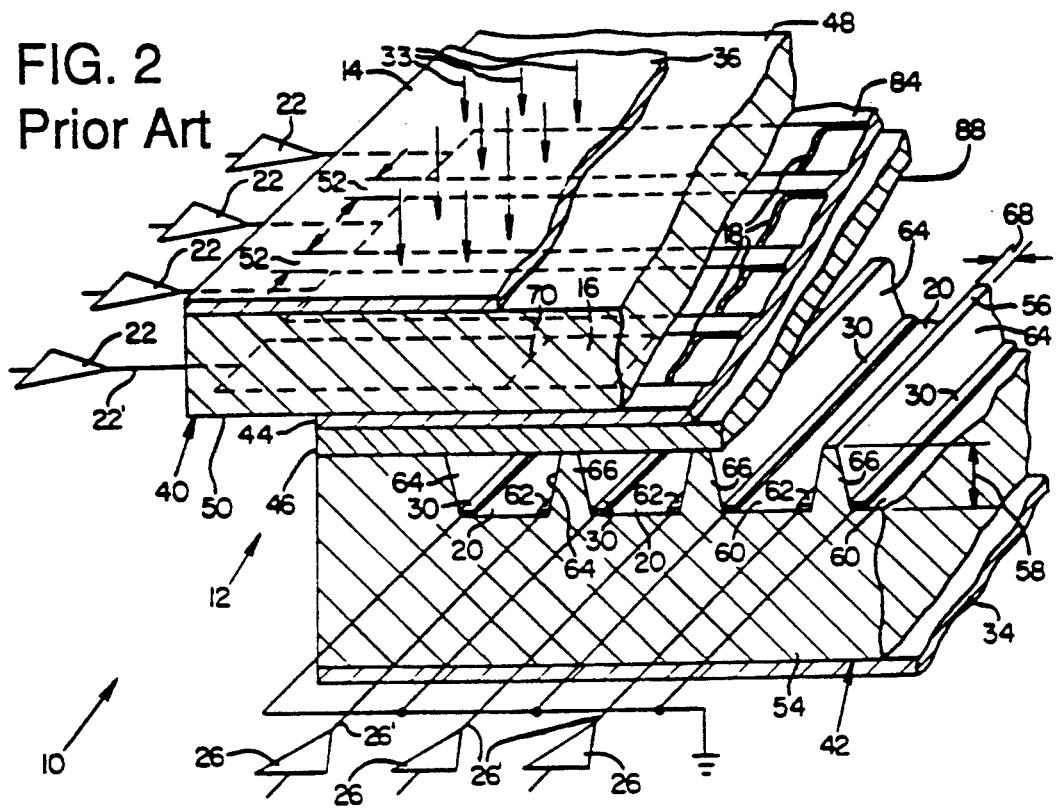
FIG. 2 is an enlarged fragmentary isometric view showing the layers of structural components forming the display panel described in the '149 Patent as viewed from the left side in FIG. 1.

Electrode structure 42 comprises a glass dielectric substrate 54 into whose inner surface 56 multiple channels 20 of trapezoidal cross section are inscribed. Channels 20 have a depth 58 measured from inner surface 56 to a base portion 60. Each one of the channels 20 has a pair of thin, narrow nickel electrodes 30 and 62 extending along base portion 60 and a pair of inner side walls 64 diverging in the direction away from base portion 60 toward inner surface 56. The reference electrodes 30 of the channels 20 are connected to a common electrical reference potential, which can be fixed at ground potential as shown. The electrodes 62 of the channels 20 are connected to different ones of the output amplifiers 26 (of which three and five are shown in FIG. 2 and FIG. 3, respectively) of data strobe 28. (The electrodes 62 are hereinafter referred to as "row electrodes 62.") To ensure proper operation of the addressing structure, the reference electrodes 30 and row electrodes 62 preferably are connected to the electrical reference potentials and the outputs 26' of data strobe 28, respectively, on opposite sides of display panel 10.

The sidewalls 64 between adjacent channels 20 define a plurality of support structures 66 whose top surfaces 56 support layer 46 of dielectric material. Adjacent ones of channels 20 are spaced apart by the width 68 of the top portion of each support structure 66, which width 68 defines the vertical space between next adjacent display elements 16 in a column. The overlapping regions 70 of column electrodes 18 and channels 20 dimensions of display elements 16, which are shown in dashed lines in FIGS. 2 and 3. FIG. 3 shows with better clarity the array of display elements 16 and the vertical and horizontal spacings between them.

The magnitude of the voltage applied to column electrodes 18 specifies the distance 52 to promote isolation of adjacent column electrodes 18. Distance 52 is typically much less than the width of column electrodes 18. The inclinations of the side walls 64 between adjacent channels 20 specify the distance 68, which is typically much less than the width of channels 20. The widths of the column electrodes 18 and the channels 20 are typically the same and are a function of the desired image resolution, which is specified by the display application. It is desirable to make distances 52 and 68 as small as possible. In current models of display panel 12, the channel depth 58 is one-half the channel width.

Each of the channels 20 is filled with an ionizable gas, preferably one that includes helium, for reasons that will be explained below. Layer 46 of dielectric material functions as an isolating barrier between the ionizable gas contained within channel 20 and layer 44 of liquid crystal material. The absence of dielectric layer 46 would permit either the liquid crystal material to flow into the channel 20 or the ionizable gas to contaminate the liquid crystal material, however. Dielectric layer 46 may be eliminated from displays that employ a solid or encapsulated electro-optic material.

Figure 6:
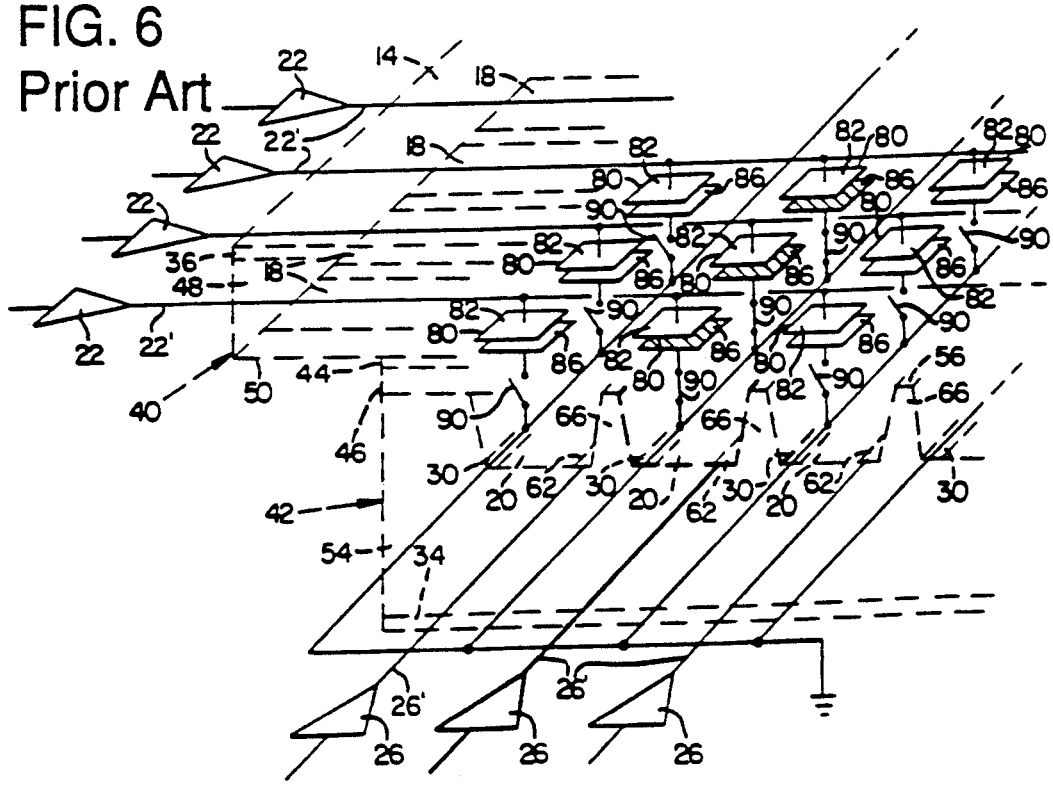
FIG. 6 is an equivalent circuit showing for a display system the operation of the plasma as a switch for an exemplary row receiving a data strobe pulse and three exemplary data columns receiving a data drive signal.

The principles underlying the operation of display panel 12 are that (1) each of its display elements 16 functions as a sampling capacitor for analog voltage data applied to the column electrode 18 forming a part of the display element and (2) the ionizable gas functions as a sampling switch. FIG. 6 is an equivalent circuit to which the following explanation of the operation of display system 10 refers.

With reference to FIG. 6, each of display elements 16 of display panel 12 can be modeled as a capacitor 80 (hereinafter "capacitor model 80"), whose top plate 82 represents one of the column electrodes 18 (FIG. 2) and whose bottom plate 86 represents the free surface 88 (FIG. 2) of layer 46 of the dielectric material. Capacitor model 80 represents the capacitive liquid crystal cell formed by an overlapping region of a column electrode 18 and a channel 20. The description herein of the operation of display system 10 refers to the capacitor model 80.

In accordance with the basic addressing procedure, data driver 24 captures a first line of data, which represents discrete samples of the time-varying voltage of analog data signal in a time interval of predetermined duration. The sample of the magnitude of the data signal at a particular instance within the time interval represents the magnitude of the analog voltage applied to a capacitor model 80 in a corresponding column position of the row electrode 62 receiving a strobe pulse. Data driver 24 develops on its output conductors 22 the analog voltages that are applied to column electrodes 18. In FIG. 6, four exemplary output amplifiers 22 of data driver 24 deliver analog voltages of positive polarity with respect to reference electrode 30 to the respective ones of column electrodes 18 to which they are connected. The application of a positive voltage on a column electrode 18 induces on free surface 88 (FIG. 2) of layer 46 of the dielectric material a voltage that is essentially equal to the magnitude of the applied voltage. This causes no change in the potential difference across capacitor model 80 and is represented in FIG. 6 by a top plate 82 and a bottom plate 86 with white surfaces.

In this instance, the gas contained in a channel 20 is in a nonionized state, and the analog voltage developed on plates 82 and 86 of capacitor model 80 is positive with respect to the voltage potential of reference electrode 30 in the channel. Whenever data strobe 28 develops a negative-going voltage pulse on the row electrode 62 positioned within a channel 20, the gas in the channel assumes an ionized state (i.e., becomes a plasma). The channel 20 whose row electrode receives the strobe pulse is represented in FIG. 6 in dark, thick lines. Under these conditions, the grounded reference electrode 30 and the strobed row electrode 62 function as an anode and a cathode, respectively, for the plasma contained within the channel.

The electrons in the plasma neutralize the induced positive voltage on the bottom plates 86 of capacitor models 80. The capacitor models 80 in the strobed row are charged with the data voltages applied across them. This condition is indicated in FIG. 6 by top plates 82 with white surfaces and bottom plates 86 with lined surfaces. Upon completion of the storage of the data voltages across capacitor models 80, data strobe 28 terminates the negative-going voltage pulse on the row electrode 62 of the strobed channel 20, thereby ending the strobe pulse and extinguishing the plasma.

Each of the row electrodes 62 is strobed in a similar manner until the entire display surface 14 is completely addressed and thereby stores an image field of data. The voltage remains stored across each of the capacitor models 80 in the strobed row for a time at least as long as the duration of the image field and is independent of subsequent changes in data voltage applied to top plate 82 capacitor model 80. The voltage stored across each of the capacitor models 80 changes in accordance with the analog data voltages representing the display data of the next succeeding image field.

In a display system 10 whose image fields are in a noninterlaced format, the analog data voltages applied to column electrodes 18 in the next succeeding image field are of opposite polarity. Alternating between positive and negative polarities from one image field to the next image field provides a long term zero net DC voltage component, which is typically required for long term operation of liquid crystal materials. The liquid crystal material produces the gray scale effect in response to the root-mean-square (rms) value of the applied analog voltage data. The display image produced is, therefore, unaffected by alternate changes in polarity of the analog voltage data.

In a display system 10 whose image fields are in an interlaced format, the analog data voltages applied to column 18 electrodes in next succeeding image frames are of opposite polarity to achieve the long term zero net DC voltage component. Each image frame includes two image fields of which each comprises one-half the number of addressable lines.

The description presented above indicates that the ionizable gas contained within each of the channels 20 operates as an electrical switch 90 whose contact position changes between binary switching states as a function of the voltage applied by data strobe 28. The switches 90 shown in FIG. 6 in the open position are connected to reference electrodes 30 and are driven by a strobe pulse applied to row electrodes 62. The absence of a strobe pulse allows the gas within the channels 20 to be in a nonionized state and thereby be in a nonconducting state. The switches 90 shown in FIG. 6 in the closed position are connected to a reference electrode 30 and are driven by a strobe pulse that is applied to row electrode 64 and is of a magnitude that causes the gas within the channel 20 to be in an ionized state and thereby be in a conducting state. In FIG. 6, the amplifier 26 shown in the middle of the three output amplifiers 26 of data strobe 28 strobes a row of capacitor models 80 to establish and store the display data voltages across them.

To function as a switch, the ionizable gas contained within channels 20 beneath electrode structure 40 communicates with layer 46 of the dielectric material to provide an electrically conductive path from layer 46 of the dielectric material to reference electrode 30. The plasma in a channel 20 whose row electrode 62 receives a strobe pulse provides a ground path to the capacitor model 80 representing the portion of liquid crystal material positioned adjacent the plasma. This allows the capacitor models 80 to sample the analog data voltages applied to column electrodes 18. Extinguishing the plasma acts to remove the conducting path, thereby allowing the data sample to be held across the display element. The voltages remain stored across layer 44 of the liquid crystal material until voltages representing a new line of data in a subsequent image field are developed across the layer 44. The above-described addressing structure and technique provide signals of essentially 100% duty cycle to every one of the display elements 16.

Figure 7:
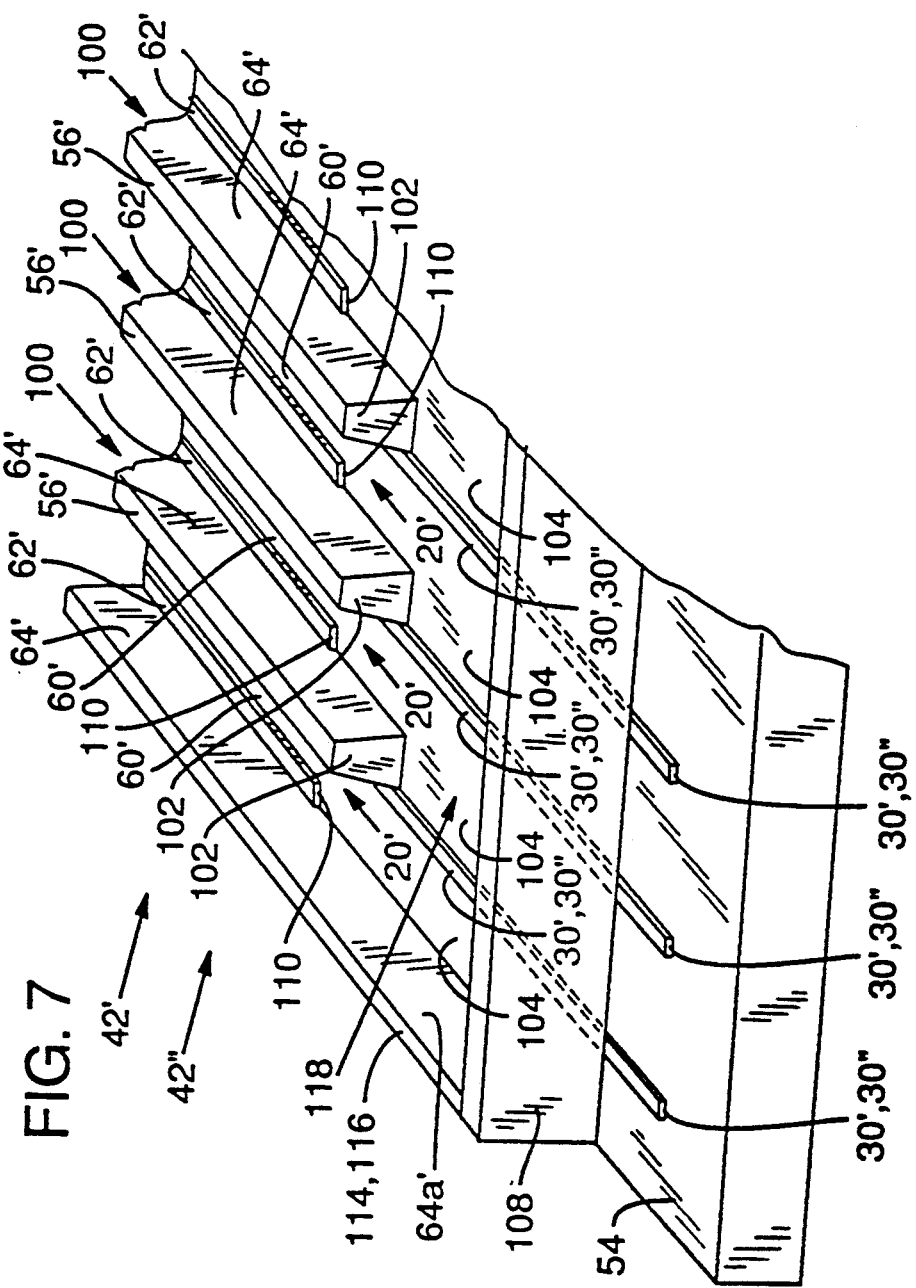
FIG. 7 is an enlarged fragmentary isometric view of an improved electrode structure for use in an addressing structure employing an ionizable gaseous medium.
Figure 8:
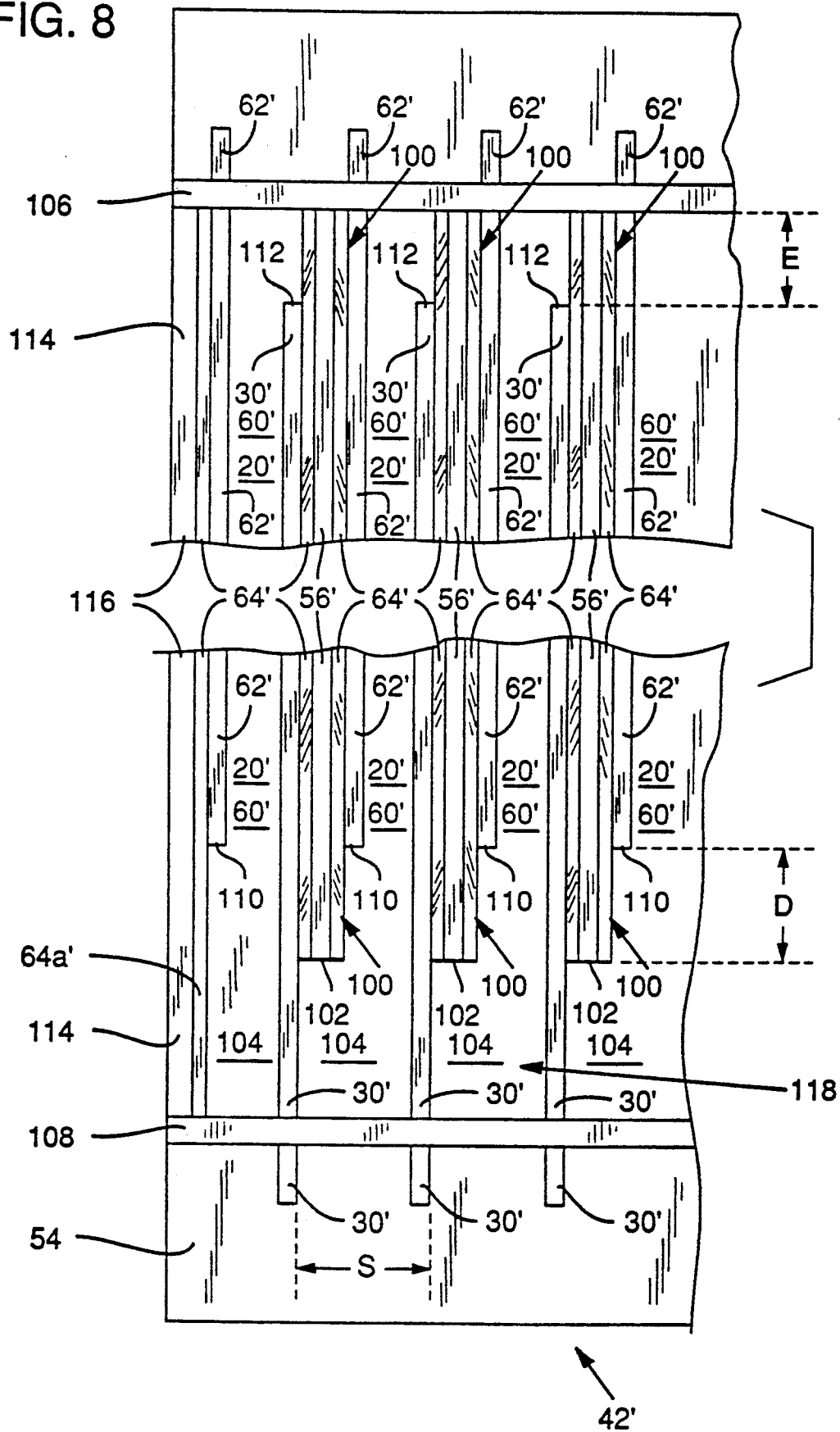
FIG. 8 is a fragmentary plan view of a first embodiment of an improved electrode structure of FIG. 7.
Figure 10:
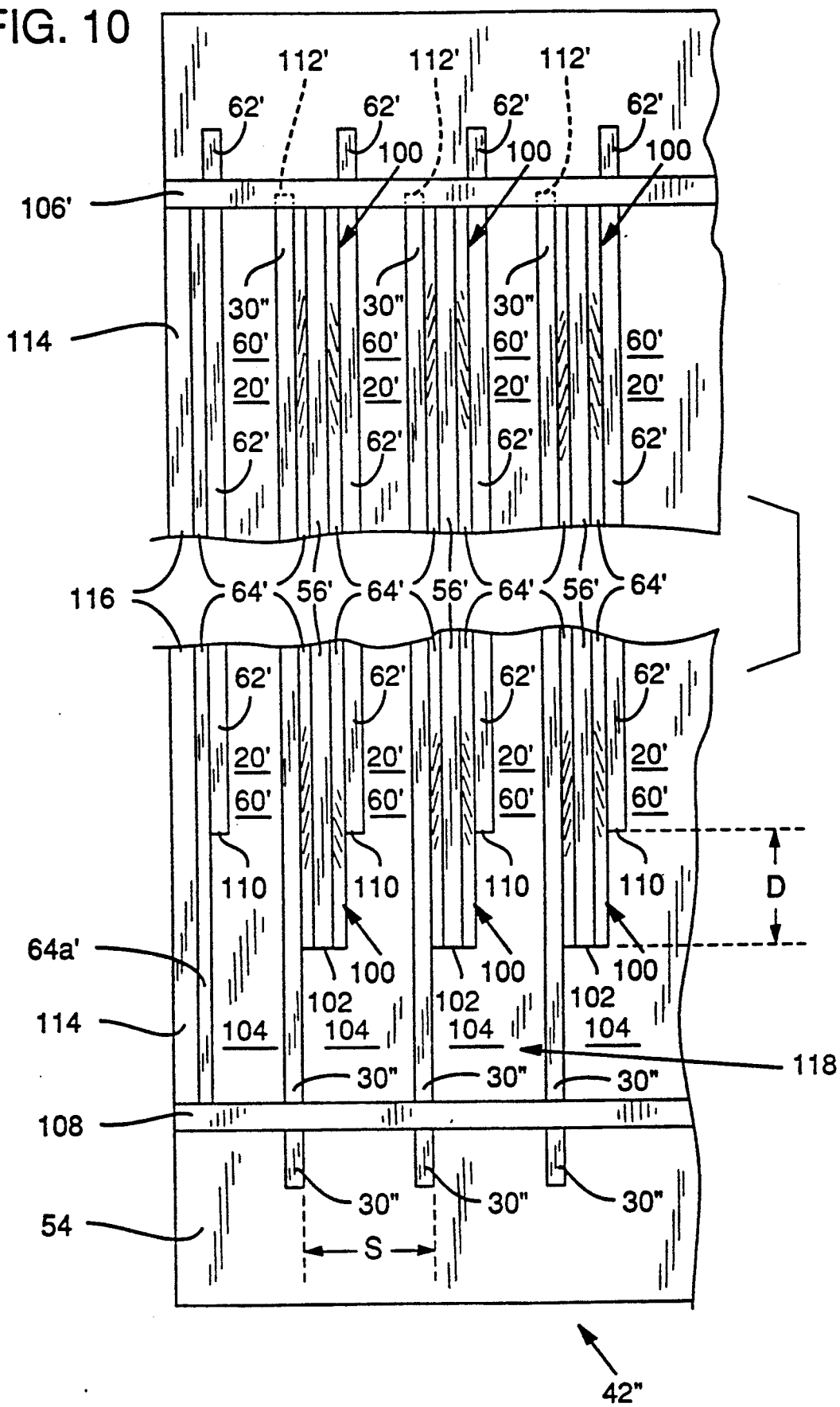
FIG. 10 is a fragmentary plan view of a second embodiment of an improved electrode structure of FIG. 7.

FIG. 7 depicts part of first and second embodiments 42' and 42", respectively, of an improved electrode structure for use in an addressing structure such as flat panel display system 10. FIG. 8 is a plan view of part of the first embodiment 42' of the improved electrode structure. FIG. 10 is a plan view of part of the second embodiment 42" of the improved electrode structure. FIG. 7 shows a part of the improved electrode structure that is common to the first embodiment 42' of FIG. 8 and the second embodiment 42" of FIG. 10. In FIGS. 7, 8, and 10 single- and double-primed reference numerals that are the same as those used in connection with FIGS. 1-6 identify parts that are nearly the same as parts identified in connection with FIGS. 1-6.

Figure 5:
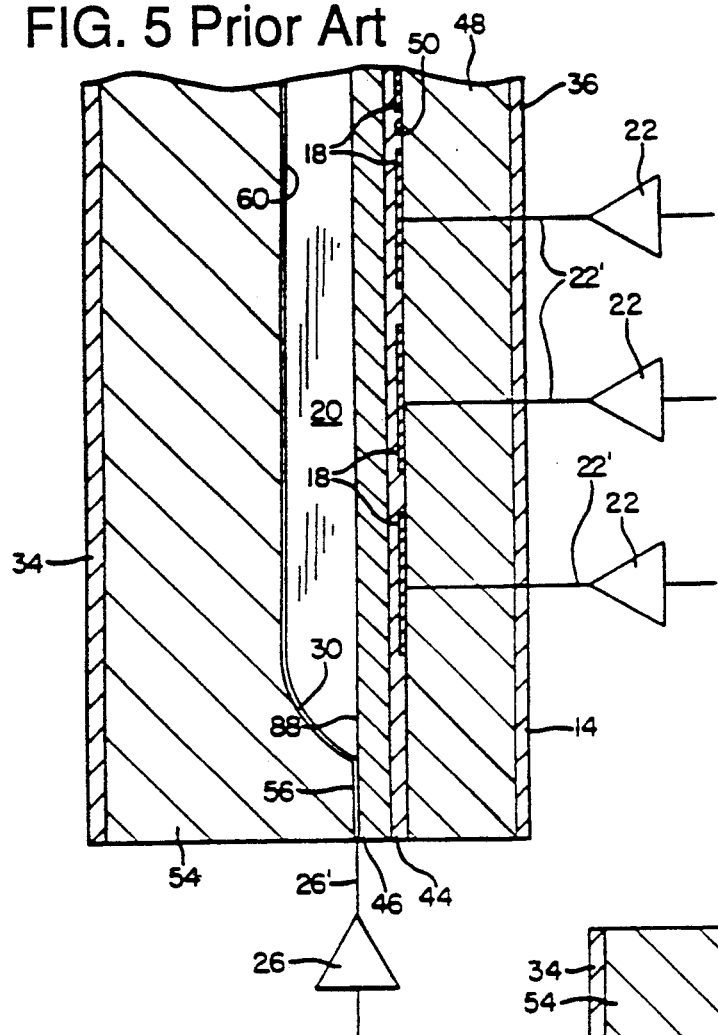
FIG. 5 is an enlarged sectional view taken along lines 5—5 of FIG. 3.
Figure 4:
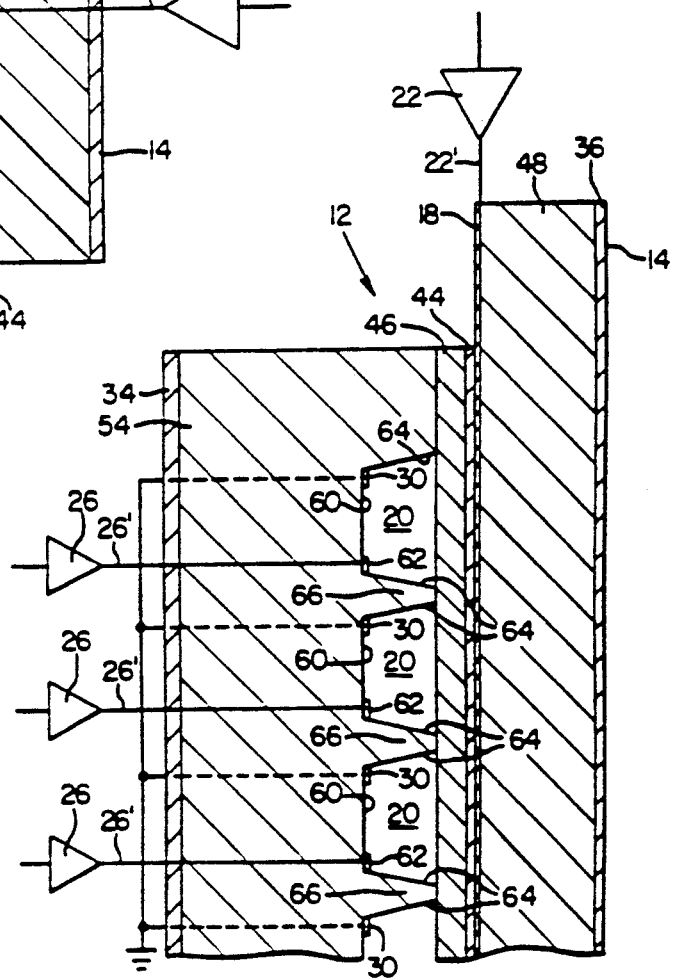
FIG. 4 is an enlarged sectional view taken along lines 4—4 of FIG. 3.

With reference to FIGS. 7, 8, and 10, each of the improved electrode structures 42' (FIG. 8) and 42" (FIG. 10) comprises a glass dielectric substrate 54. Channel-defining portions 100 divide the space above substrate 54 into a plurality of channels 20'. Each channel-defining portion 100 has two side walls 64' and a top surface 56'. The top surface 56' supports the bottom surface of dielectric material 46, which is best shown in FIGS. 2, 4, and 5. Each channel has associated with it one reference electrode 30' (FIG. 8) or 30" (FIG. 10) and one row electrode 62'. The channel-defining portions may be formed in any convenient manner, such as by inscribing channels in substrate 54, by depositing channel-defining portions on a surface of substrate 54 by silkscreening and photopatterning, or by chemically etching an appropriate structure. Channel-defining portions 100, substrate 54, and layer 46 provide a barrier to the passage of a plasma discharge of ions and of current directly between adjacent channels 20'.

Reference electrodes 30' (FIG. 8) and 30" (FIG. 10) function electrically as anodes referenced to a common reference potential (hereinafter referred to as "ground"), and row electrodes 62' of FIGS. 7 and 8 function electrically as cathodes. As shown in FIGS. 7, 8, and 10, each channel-defining portion 100 terminates in an end 102. The base surface 60' of each channel 20' joins at each end 102 with a plenum base surface 104. As best shown in FIG. 8, row electrodes 62' enter electrode structure 42' through or below (and thus extend beyond) a first perimeter seal 106 (FIG. 8) or 106' (FIG. 10). Row electrodes 62' are connected to electrical driving circuitry (not shown) outside first perimeter seal 106 (FIG. 8) or 106' (FIG. 10). Reference electrodes 30' (FIG. 8) or 30" (FIG. 10) extend across the plenum base surface 104 and pass through or below (and thus extend beyond) a second perimeter seal 108. Outside the second perimeter seal 108 the reference electrodes 30' are electrically connected to electrical circuitry (not shown).

The electrode structure has two end walls 114 (only one shown) positioned on opposite sides of the complete structures 42' and 42". Side wall 64' of each end wall 114 has a portion 64a' which extends beyond the ends 102 of the channel-defining portions 110. Each end wall 114 has a top surface 116, which helps to support layer 46, and a side wall 64'. Plenum 118 is the volume defined by plenum base surface 104, layer 46, ends 102 of channel-defining portions 100, and parts 64a' of side wall 64' of the two end walls 114 of the electrode structure.

As best shown in FIGS. 8 and 10, each row electrode 62' has an end 110 spaced a distance D from ends 102 of the two adjacent channel-defining portions 100 the row electrode 62' is positioned between. The distance D is selected before manufacturing electrode structure 42' or 42" to accomplish the objective described below.

FIGS. 7, 8, and 10 show only fragmentary views of electrode structures 42' (FIG. 8) or 42" (FIG. 10). Electrode structures 42' (FIG. 8) and 42" (FIG. 10) typically contain several hundred to several thousand channels 20', and each channel 20' typically extends on the order of 100 to 200 times the separation between end 102 of each channel-defining structure 100 and second perimeter seal 108.

When electrode structure 42' (FIG. 8) or 42" (FIG. 10) is incorporated into an addressing structure, channels 20' and plenum 118 are filled with an ionizable gaseous medium at a predetermined pressure, and each row electrode 62' is fired against a reference electrode 30' (FIG. 8) or 30" (FIG. 10) with a firing signal of predetermined voltage and waveform to operate the addressing structure. Examples of particular gaseous media, and of particular pressures, are provided in the '149 Patent, particularly in FIG. 8 and at col. 10, 11. 38-60.

Distance D is selected so that, when a firing signal is placed across a particular row electrode 62' and a particular reference electrode 30' (FIG. 8) or 30" (FIG. 10) in a channel 20', the plasma discharge between that row electrode 62' and that reference electrode 30' (FIG. 8) or 30" (FIG. 10) (1) occurs in that channel 20' and between that row electrode 62' and that reference electrode 30' (FIG. 8) or 30" (FIG. 10), and (2) does not propagate into the plenum 118 in an undesirable way (as defined below).

One undesirable effect which distance D is selected to prevent is the firing of a row electrode 62' as a cathode in one channel 20' against (a) a reference electrode 30' (FIG. 8) or 30" (FIG. 10) as an anode in a different channel and/or (b) a row electrode 62' at ground in a different channel. The possibility of such misfiring arises from the way in which reference electrodes 30' (FIG. 8) and 30" (FIG. 10) and row electrodes 62' are electrically connected in a typical addressing structure.

A typical addressing structure (such as a flat-panel display) may have several hundred to several thousand channels; each channel will have a reference electrode 30' (FIG. 8) or 30" (FIG. 10) and a row electrode 62'. It is costly to provide a switch to isolate each reference electrode 30' (FIG. 8) or 30" (FIG. 10) in each channel 20' from ground. To avoid that expense all reference electrodes 30' (FIG. 8) or 30" (FIG. 10) may be directly connected to ground, as shown for reference electrodes 30 in FIG. 11A of the '149 Patent. Alternatively, groups of reference electrodes 30' (FIG. 8) or 30" (FIG. 10) may be provided with one driver, as illustrated for reference electrodes 30 in FIG. 11B of the '149 Patent, and those drivers may act electrically as switches.

In either alternative, there are a number of alternative firing paths from a fired row electrode 62', through the ionizable gaseous medium in channels 20' and in plenum 118, to different reference electrodes 30' (FIG. 8) and 30" (FIG. 10), and thence to ground. It is also costly to provide electrical isolation from ground for each row electrode 62' is not firing. Such electrical isolation from ground could be provided by a switch in the leads to each row electrode 62' or by providing for each row electrode 62' a driver which acts electrically like a switch. Either those alternatives may, however, be too expensive. Thus, in a typical addressing structure each row electrode 62' is connected to ground when it is not firing.

If a fired row electrode 62' misfires by creating a plasma discharge with a reference electrode 30' (FIG. 8) or 30" (FIG. 10) or with another row electrode 62' not located in the same channel 20' as the fired row electrode 62' (hereinafter an "improper electrode"), undesirable effects can occur.

First, the addressing structure may not operate properly. The plasma discharge with the improper electrode may improperly clear the charge from one or more of display elements 16 (particularly the one or two display elements nearest plenum 118) in the channel 20' in which the improper electrode is located by allowing charge to flow to or from regions of the surface of the cover portion for that channel 20. (In the capacitor model shown in FIG. 6, such improper clearing corresponds to improper closing of a switch 90.) The plasma discharge with the improper electrode may also cause some of the display elements defined in part by the channel 20' in which the firing row electrode 62' is located not to be properly accessed by the plasma discharge in that channel 20'. (In the capacitor model shown in FIG. 6, such improper accessing of the display elements corresponds to failure of a switch 90 to close when it is intended to close.)

Second, the undesired discharge may extend into plenum 118. The gaseous medium in plenum 118 can carry a higher current than the gaseous medium confined within the channels 20'. This is so because the walls of plenum 118 (which tend to quench a plasma discharge) are farther from most of the volume of plenum 118 than the walls defining each channel 20' are from most of the volume of the gaseous medium within each channel 20'. That higher current can damage or erode the involved cathode by arcing or sputtering and can erode the involved anode by arcing. That higher current may also interfere with the proper operation of the electrode structure by damaging second perimeter seal 108. The material of which second perimeter seal 108 is formed may disassociate as a result of ion bombardment, thus contaminating the ionizable gaseous medium. If second perimeter seal 108 is sufficiently eroded, it may fail as a barrier and permit air to enter the electrode structure and/or permit the ionizable gaseous medium to leak out from the electrode structure.

Another undesirable effect that distance D is selected to prevent is the extension into plenum 118 of a plasma discharge created by the proper firing of a row electrode 62' with a reference electrode 30' (FIG. 8) or 30" (FIG. 10), where both the firing reference electrode 62' and the involved reference electrode 30' (FIG. 8) or 30" (FIG. 10) are in the same channel 20'. Such an extension of the plasma discharge can lead to higher discharge currents for the reasons described immediately above. Such higher discharge currents can damage the firing row electrode 62', the involved reference electrode 30' (FIG. 8) or 30" (FIG. 10), and the second perimeter seal 108 in the ways described immediately above. This undesirable effect can exist even if each reference electrode 30' (FIG. 8) or 30" (FIG. 10) and each row electrode 62' has its own driving circuit (or at least has a switch to connect it to and to disconnect it from an appropriate driving circuit).

The way of determining distance D can be illustrated with reference to the Paschen curve, which is well known to skilled persons.

Figure 9:
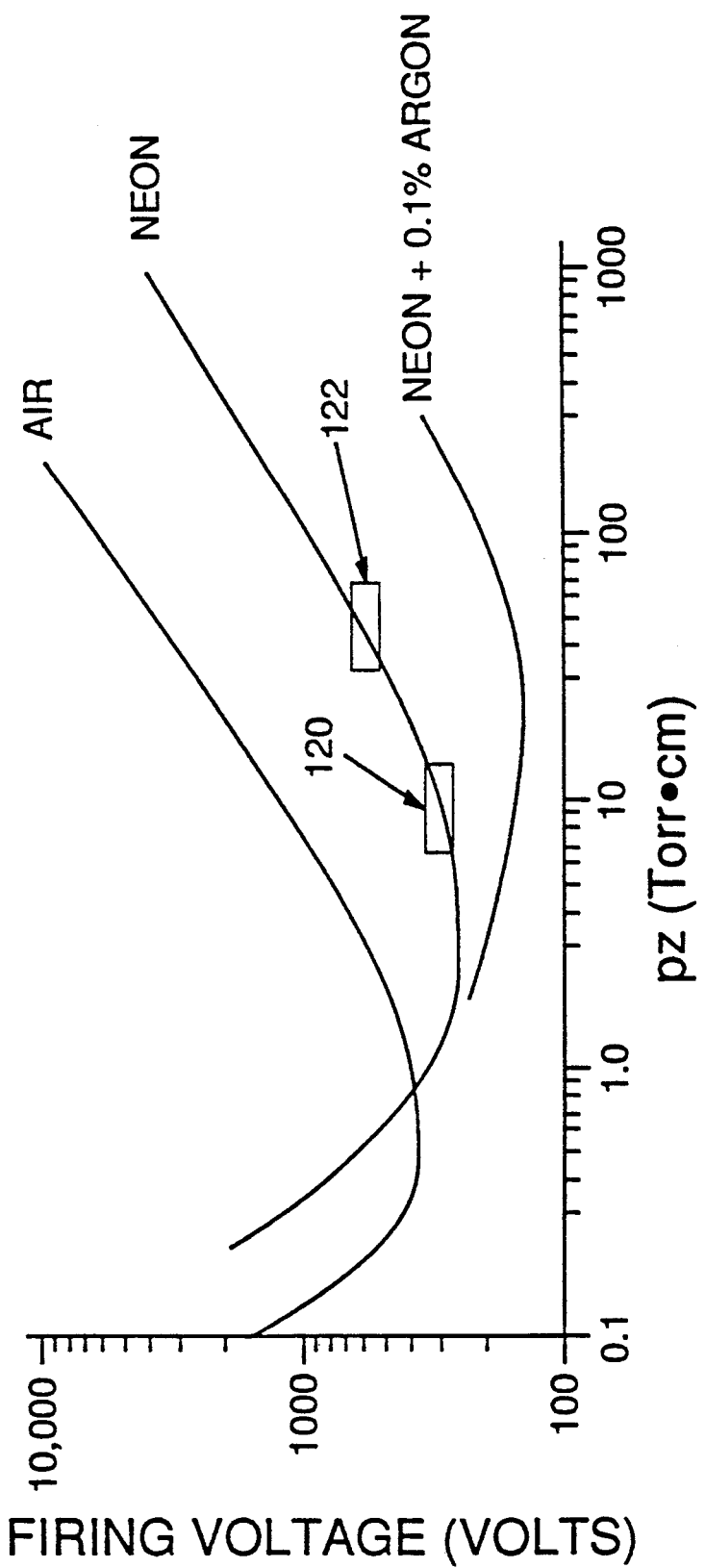
FIG. 9 shows the typical shape of a Paschen curve in a device using an ionizable gaseous medium. Except for the addition of the regions 120 and 122.

A Paschen curve expresses a relationship between (a) the product of the pressure of an ionizable gaseous medium and the separation between the anode and the cathode and (b) the voltage between the anode and the cathode that brings about ionization and hence firing of the ionizable gaseous medium. The general characteristics of a Paschen curve are described at pages 347-348 of *Flat-Panel Displays and CRTs* (L. E. Tannas, Jr., ed.) (1985) (New York: Van Nostrand Reinhold). FIG. 9 herein is taken from FIGS. 10-13 of the work just cited, except for the addition of the regions 120 and 122, which are described below.

With reference to FIG. 9, the Paschen curves shown are examples for gaseous media including neon but are believed to be qualitatively representative in their form of those for helium, which is the preferred ionizable gaseous medium used in the present invention. Although it is generally of U-shaped form, a Paschen curve depends on the predetermined geometry and material of the electrode and on the predetermined ionizable gaseous medium. The Paschen curves shown in FIG. 9 are, therefore, qualitatively representative of the variation of firing voltage with the product of gas pressure, "p", and anode-cathode separation, "z", in an electrode structure 42' (FIG. 8) or 42" (FIG. 10) and can be used to illustrate the principle involved in selecting the distance D.

As was stated above, in the preferred embodiments, helium is the preferred ionizable gaseous medium. Assume hypothetically that FIG. 9 pertains to helium as well as neon and that the product of the helium gas pressure and the separation between a row electrode 62' and an adjacent reference electrode 30' (FIG. 8) or 30" (FIG. 10) is somewhere near pz=10 on the horizontal scale of FIG. 9, such as in region 120.

To prevent unwanted discharge from row electrodes 62' from reaching plenum 118, a distance D is selected so that the product of the pressure and that distance D corresponds to a region sufficiently high above the region on the Paschen curve corresponding to the separation between a row electrode 62' and a reference electrode 30' (FIG. 8) or 30" (FIG. 10) so that the undesired discharge does not occur.

FIG. 9 shows a region 122 as a hypothetical example of selection of such a distance D. In choosing a distance D to eliminate discharges into the plenum in an electrode structure 42' (FIG. 8) or 42" (FIG. 10), important considerations will include the shape of the Paschen curve for the particular electrode structure 42' (FIG. 8) or 42" (FIG. 10), the degree to which the electrical driving circuits regulate the highest voltage they place across a row electrode 62' and a reference electrode 30' (FIG. 8) or 30" (FIG. 10), and the actual behavior of the particular electrode structure when fired with the particular firing signal waveform to be used. In a practical electrode structure 42' (FIG. 8) or 42" (FIG. 10) the operating region on the Paschen curve for desired discharge between anodes and cathodes (that is, the point corresponding to the region 120 in FIG. 9) will usually be to the right of the minimum voltage of the Paschen curve.

Again with reference to FIG. 9, these general principles of determining the distance D can be illustrated hypothetically. If the circuitry which generates the firing voltage rarely or never generates voltages of 500 volts, the region 122 on the Paschen curve labeled "neon" in FIG. 9 corresponding generally to a voltage of 500 volts is not accessible to the system for any significant portion of the operating time of the system. The region 122 corresponds to a product of gas pressure and anode-cathode separation that is larger than that for the region 120.

Referring now to FIGS. 7, 8, and 10 with this hypothetical example in mind, the gas pressure is the same in both regions 120 and 122 of FIG. 9 in an electrode structure such as electrode structure 42' (FIG. 8) or 42" (FIG. 10). Thus, the distance (measured parallel to the length of the channel 20') between the end 110 of row electrode 62' and the end of channel 20' (that is, which corresponds to the end 102 of a channel-defining portion 100) should be considerably larger than the separation between reference electrode 30' (FIG. 8) or 30" (FIG. 10) and row electrode 62'.

As explained above, the Paschen curve for a real electrode structure such as electrode structure 42' of (FIG. 8) or 42" (FIG. 10) is ordinarily different from the Paschen curves of FIG. 9. Therefore, the hypothetical example just given does not usually apply directly to a real electrode structure 42' but does illustrate the general principle involved in selecting distance D.

As also explained above, a Paschen curve expresses a relationship pertaining to the firing of electrodes through an ionizable gaseous medium. Experience shows that a Paschen curve relationship for the firing of electrodes does not represent (except in a general, qualitative sense) the spreading of a plasma discharge through an ionizable gaseous medium after firing between electrodes is initiated. Thus, to prevent a plasma discharge initiated in a channel 20' from spreading into plenum 118 and from spreading to an improper electrode, the distance D between the end of a row electrode 62' and end 102 of a channel-defining portion must be larger than Paschen curve analysis would predict.

As an example, in an electrode structure using helium gas as the preferred ionizable gaseous medium, the distance D should be at least five, and preferably greater than ten, times the width of a display element measured in a direction parallel to the channel. Because the width of a display element is of the order of the pitch S of the channels, the distance D should be at least on the order of ten times the pitch S of the channels. (The pitch S of the channels (FIGS. 8 and 10) is the average distance measured in the direction perpendicular to the length of the channels from a point in one channel to a corresponding point in an adjacent channel.) The separation between a row electrode and a reference electrode is normally less than the pitch S of the channels. The distance D would accordingly be a higher multiple of the separation between a row electrode and a reference electrode than it is of the pitch S of the channels. The proper distance D will depend on the geometry and materials of electrode structure 100 (including the geometry and materials of reference electrodes 30' (FIG. 8) or 30" (FIG. 10) and of row electrodes 62'), on the type and pressure of the ionizable gaseous medium employed, and on the waveform of the firing signal.

The distance D does not have to be so large that no plasma discharge, and no ions generated by plasma discharge, ever reach plenum 118. The distance D has to be sufficiently large only so that (1) plasma discharge does not reach plenum 118 in an amount that causes unacceptable degradation of any electrode; (2) plasma discharge does not reach plenum 118 in an amount that causes unacceptable degradation of second perimeter seal 108; (3) ions resulting from plasma discharge do not produce an unintended change in the state of any of display elements 16 (FIG. 1); and (4) plasma discharge in a channel in which the plasma discharge is intended to occur is sufficiently intense to provide the desired electrical switch effect as illustrated in the capacitor model of FIG. 6. As used herein, the term "undesirable plasma discharge" means an amount of plasma discharge that defeats any one or more of the objectives just stated.

The distance D should be at least large enough so that the ionizable gaseous medium in plenum 118 does not have a greater tendency to fire than the ionizable gaseous medium in channels 20. Of course, the larger the distance D, the fewer the ions from a plasma discharge in a channel 20' that will reach plenum 118. The fewer ions from a plasma discharge in a channel that reach plenum 118, the less the risk of damage to electrodes, the less the risk of degradation of second perimeter seal 108, and the less the risk that the ions will interfere with proper operation of the addressing structure, and the less the risk that there will be insufficient plasma discharge in a channel to accomplish an intended electrical switch effect.

A suitable distance D is best obtained and confirmed by experiment on the particular electrode structure 42' (FIG. 8) or 42" (FIG. 10), the particular electrical driving signal, and the type and pressure of the ionizable gaseous medium to be used. The distance D should be selected to be large enough to prevent undesirable plasma discharge from reaching the plenum 118 even when the variations inevitable in the manufacture and operation of practical electrode structures are present.

With the distance D selected as described above, erosion of the anodes and the cathodes, and degradation or erosion of the second perimeter seal, are greatly reduced.

Referring to FIG. 8, end 112 of each reference electrode 30' is separated from first perimeter seal 106 of the electrode structure 42' by a distance E. The distance E is selected, according to the principles explained above in connection with selecting the distance D, so that relatively little plasma discharge occurs in the gaseous medium immediately adjacent to first perimeter seal 106. Too much plasma discharge in a channel 20' immediately adjacent to the first perimeter seal portion 100 can erode first perimeter seal 106 by disassociation of the material of which it is formed. Such erosion can contaminate the ionizable gaseous medium and thereby interfere with proper operation of the addressing structure.

If first perimeter seal 106 is eroded so much that it no longer forms an effective seal to keep the ionizable gaseous medium inside the electrode structure 42' and to keep air out of the interior of the electrode structure 42', electrode structure 42' will not operate properly and will have to be replaced. As used herein, "unwanted" plasma discharge is plasma discharge that has any one of these effects on first perimeter seal 106 (FIG. 8). The extent of acceptable plasma discharge in the volume immediately adjacent first perimeter seal 106 depends on the resistance of first perimeter seal 106 to erosion, on the degree to which the ionizable gaseous medium can be contaminated by products of disassociation of first perimeter seal 106, and on the acceptable useful life of electrode structure 42'. Skilled persons can readily select or determine by experiment an appropriate distance E to meet the goals of the invention.

The distance E does not have to be so large that no plasma discharge, and no ions generated by plasma discharge, ever reach first perimeter seal 106. The distance E has to be sufficiently large only so that no unwanted plasma discharge occurs.

A first embodiment of a preferred electrode structure 42' has as its ionizable gaseous medium helium at a pressure of approximately 200 mbar. The channels 20' are approximately 127 mm long and have a pitch of approximately 0.38 mm. Each channel 20' extends approximately 0.15 mm between layer 46 and substrate 54; each channel is approximately 0.35 mm wide. In the channels 20' the separation between the row electrode and the reference electrode is approximately 0.10 mm. The row and reference electrodes are formed of aluminum. Plenum 118 is approximately 0.76 mm in a direction parallel to channels 20', approximately 132 mm in a direction perpendicular to channels 20', and approximately 0.15 mm between substrate 54 and layer 46. The distance D is approximately 5 mm, and distance E is approximately 5 mm. Reference electrodes 30' are connected directly to the ground reference. The maximum potential on a row electrode 62' is approximately 375 volts, and the maximum current between a row electrode 62' and a reference electrode 30' is approximately 40 milliamperes.

FIG. 10 is a plan view of a second embodiment of the invention. As shown in FIG. 10, an electrode structure 42" has reference electrodes 30" which end in ends 112' embedded in first perimeter seal 106'. In other respects electrode structure 42" is the same as electrode structure 42'.

Electrode structure 42" reduces damage to first perimeter seal 106 from plasma discharge by eliminating contact between the ionizable gaseous medium and end 112' of reference electrodes 30". An end of an electrode can undergo more intense interaction with a discharge, caused by more intense electric fields at an end than near the middle of an electrode. Embedding end 112' of reference electrodes 30" in first perimeter seal 106' eliminates such end effects and thereby reduces the intensity of plasma discharge near the first perimeter seal. This in turn decreases the risk of contamination resulting from erosion or disassociation of first perimeter seal 106' and thereby increases the useful life of electrode structure 42" before repairs. The dimensions given above for a preferred working embodiment of electrode structure 42' apply to electrode structure 42", except of course for the distance E, which is not meaningful in the context of electrode structure 42".

It will be apparent to skilled persons that many changes may be made to details of the specific embodiments of the invention described herein without departing from the underlying principles thereof. The scope of the invention should, therefore, be determined only by the following claims.

I claim:

1. In an addressable electro-optic system including a substrate having plural nonoverlapping channels that extend along a major surface thereof, each of the channels having first and second ends, containing an ionizable gaseous medium, and having first and second channel electrodes extending along the length of the channel, and each of the first and second channel electrodes having first and second ends, the improvement comprising:

first and second perimeter seals positioned adjacent to and transversely of the respective first and second ends of the channels, the first perimeter seal being positioned near the first ends of the channels and the second perimeter seal being spaced apart from the second ends of the channels to form a plenum for the channels; and multiple ones of the first channel electrodes having their second ends recessed at least a distance D from the second ends of the channels with which the plural first channel electrodes are associated to prevent undesirable plasma discharge during operation of the system.

2. The system of claim 1 in which each of the channels has a pitch S and the distance D has a value such that $5S \leq D \leq 10S$.

3. The system of claim 1 in which the distance D is sufficiently large that the ionizable gaseous medium residing in the plenum has no greater tendency to ignite than the ionizable gaseous media residing in the channels.

4. The system of claim 1 in which the first channel electrodes extend beyond the first perimeter seal.

5. The system of claim 1, further comprising multiple ones of the second channel electrodes having their first ends recessed at least a distance E from the first perimeter seal, the distance E being sufficiently large to prevent unwanted plasma discharge against the first perimeter seal during operation of the system.

6. The system of claim 5 in which each of the channels has a pitch S and the distance D has a value such that $5S \leq D \leq 10S$.

7. The system of claim 5 in which the distance D is sufficiently large that the ionizable gaseous medium residing in the plenum has no greater tendency to ignite than the ionizable gaseous media residing in the channels.

8. The system of claim 5 in which the second channel electrodes intersect a surface that defines the plenum.

9. The system of claim 5 in which the second channel electrodes extend beyond the second perimeter seal.

10. The system of claim 5 in which the number of first channel electrodes equals the number of second channel electrodes.

11. The system of claim 5 in which the first and second channel electrodes are adapted to, respectively, receive applied electrical signals and be connected to a ground potential.

12. The system of claim 5 in which the first and second channel electrodes for each channel extend in side-by-side, spaced-apart relation for a distance shorter than the length of the channel in a region between the first and second ends of the channel.

13. The system of claim 1, further comprising multiple ones of the second channels having their first ends embedded in the first perimeter seal.

14. The system of claim 13 in which each of the channels has a pitch S and the distance D has a value such that $5S \leq D \leq 10S$.

15. The system of claim 13 in which the distance D is sufficiently large that the ionizable gaseous medium residing in the plenum has no greater tendency to ignite than the ionizable gaseous media residing in the channels.

16. The system of claim 13 in which the second channel electrodes intersect a surface that defines the plenum.

17. The system of claim 13 in which the second channel electrodes extend beyond the second perimeter seal.

18. The system of claim 13 in which the number of first channel electrodes equals the number of second channel electrodes.

19. The system of claim 13 in which the first and second channel electrodes are adapted to, respectively, receive applied electrical signals and be connected to a ground potential.

20. The system of claim 13 in which the first and second channel electrodes for each channel extend in side-by-side, spaced-apart relation for a distance shorter than the length of the channel in a region between the first and second ends of the channel.

* * * * *